(12) United States Patent
Ogura et al.

(10) Patent No.: US 9,504,139 B2
(45) Date of Patent: Nov. 22, 2016

(54) ELASTIC FLEXIBLE SUBSTRATE AND MANUFACTURING METHOD THEREFOR

(71) Applicant: Panasonic Intellectual Property Management Co., Ltd., Osaka (JP)

(72) Inventors: Tetsuyoshi Ogura, Osaka (JP); Daisuke Wakuda, Osaka (JP); Takashi Matsumoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 30 days.

(21) Appl. No.: 14/626,881

(22) Filed: Feb. 19, 2015

(65) Prior Publication Data

US 2015/0282296 A1 Oct. 1, 2015

(30) Foreign Application Priority Data

Mar. 31, 2014 (JP) ................................. 2014-073569

(51) Int. Cl.
| | | |
|---|---|---|
| *H05K 1/02* | (2006.01) | |
| *H05K 1/03* | (2006.01) | |
| *H05K 3/10* | (2006.01) | |
| *H05K 1/09* | (2006.01) | |
| *H05K 1/11* | (2006.01) | |
| *H05K 1/18* | (2006.01) | |
| *A41D 31/00* | (2006.01) | |

(52) U.S. Cl.
CPC .......... *H05K 1/0213* (2013.01); *H05K 1/0274* (2013.01); *H05K 1/0283* (2013.01); *H05K 1/0296* (2013.01); *H05K 1/038* (2013.01); *H05K 1/0366* (2013.01); *H05K 1/09* (2013.01); *H05K 1/115* (2013.01); *H05K 1/189* (2013.01); *H05K 3/103* (2013.01); *A41D 31/00* (2013.01); *H05K 1/028* (2013.01); *H05K 1/0281* (2013.01); *H05K 2201/0141* (2013.01); *H05K 2201/0145* (2013.01); *H05K 2201/0154* (2013.01); *H05K 2201/0326* (2013.01); *H05K 2201/09063* (2013.01); *H05K 2201/09854* (2013.01); *H05K 2201/10083* (2013.01); *H05K 2201/10151* (2013.01); *Y10T 29/49162* (2015.01)

(58) Field of Classification Search
CPC .. H05K 1/0213; H05K 1/115; H05K 1/0296; H05K 1/189; H05K 1/0274; H05K 1/0366; H05K 1/09; H05K 3/103
USPC ............................................ 174/254; 29/850
See application file for complete search history.

(56) References Cited

U.S. PATENT DOCUMENTS

2010/0097512 A1* 4/2010 Miyazawa ........ H01L 27/14623
348/311
2014/0140133 A1* 5/2014 Yamakoshi ....... H01L 27/11519
365/185.05

FOREIGN PATENT DOCUMENTS

| JP | 1-135758 U | 9/1989 |
| JP | 6-140727 | 5/1994 |
| JP | 2009-224508 | 10/2009 |

* cited by examiner

*Primary Examiner* — Timothy Thompson
*Assistant Examiner* — Charles Pizzuto
(74) *Attorney, Agent, or Firm* — McDermott Will & Emery LLP

(57) ABSTRACT

There is provided an elastic flexible substrate including an insulating film base material which includes a wire. The insulating film base material includes an opening which is formed by opening a slit, and an opened state of the opening is held by an insulating member.

18 Claims, 10 Drawing Sheets

ELASTIC FLEXIBLE SUBSTRATE AND MANUFACTURING METHOD THEREFOR

CROSS REFERENCES TO RELATED APPLICATIONS

This application claims priority to Japanese Patent Application No. 2014-073569, filed on Mar. 31, 2014, the contents of which are hereby incorporated by reference.

BACKGROUND

1. Technical Field

The present disclosure relates to an elastic flexible substrate and a manufacturing method therefor. More particularly, the present disclosure relates to an elastic flexible substrate which can be used as a circuit board and also relates to a manufacturing method for the elastic flexible substrate.

2. Description of the Related Art

Along with the reduction in size and thickness of electronic devices, flexible substrates have been used in various electronics devices. Such a flexible substrate is often used in a bent state from the perspective of space saving. The flexible substrate is uniformly thin and has flexibility.

In recent years, use of flexible substrates in various fields has been expected. Use of flexible substrates is not limited to the field of electronics devices, where flexible substrates are commonly used, and is being considered in the field of robots, the healthcare field, the medical field, the nursing care field, and the like. For example, use of a flexible substrate for the purpose of arranging a sensor on a free curved surface, such as a surface of a palm, in a touch panel having a relatively strongly curved shape, such as a "spherical" shape, for the purpose of incorporating a sensor in an object which bends and expands or contracts when used, such as a clothing item, and for other purposes is being contemplated.

Japanese Unexamined Patent Application Publication Nos. 6-140727 and 2009-224508 and Japanese Unexamined Utility Model Registration Application Publication No. 1-135758 are examples of related art.

SUMMARY

Flexible substrates in related art have flexibility or bendability but do not have elasticity.

In one general aspect, the techniques disclosed here feature an elastic flexible substrate which includes an insulating film base material and a wire provided at the insulating film base material. The insulating film base material includes an opening which is formed by opening a slit, and an opened state of the opening is held by an insulating member.

These general and specific aspects may be implemented using a system, a method, and a computer program, and any combination of systems, methods, and computer programs.

According to the one aspect, in an elastic flexible substrate of the present disclosure, an insulating film base material includes an opening which is formed by opening a slit, and an opened state of the opening is held by an insulating member. With this configuration, the elastic flexible substrate has elasticity.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of such benefits and/or advantages.

DETAILED DESCRIPTION

Elastic Flexible Substrate of Present Disclosure

Figure 1:
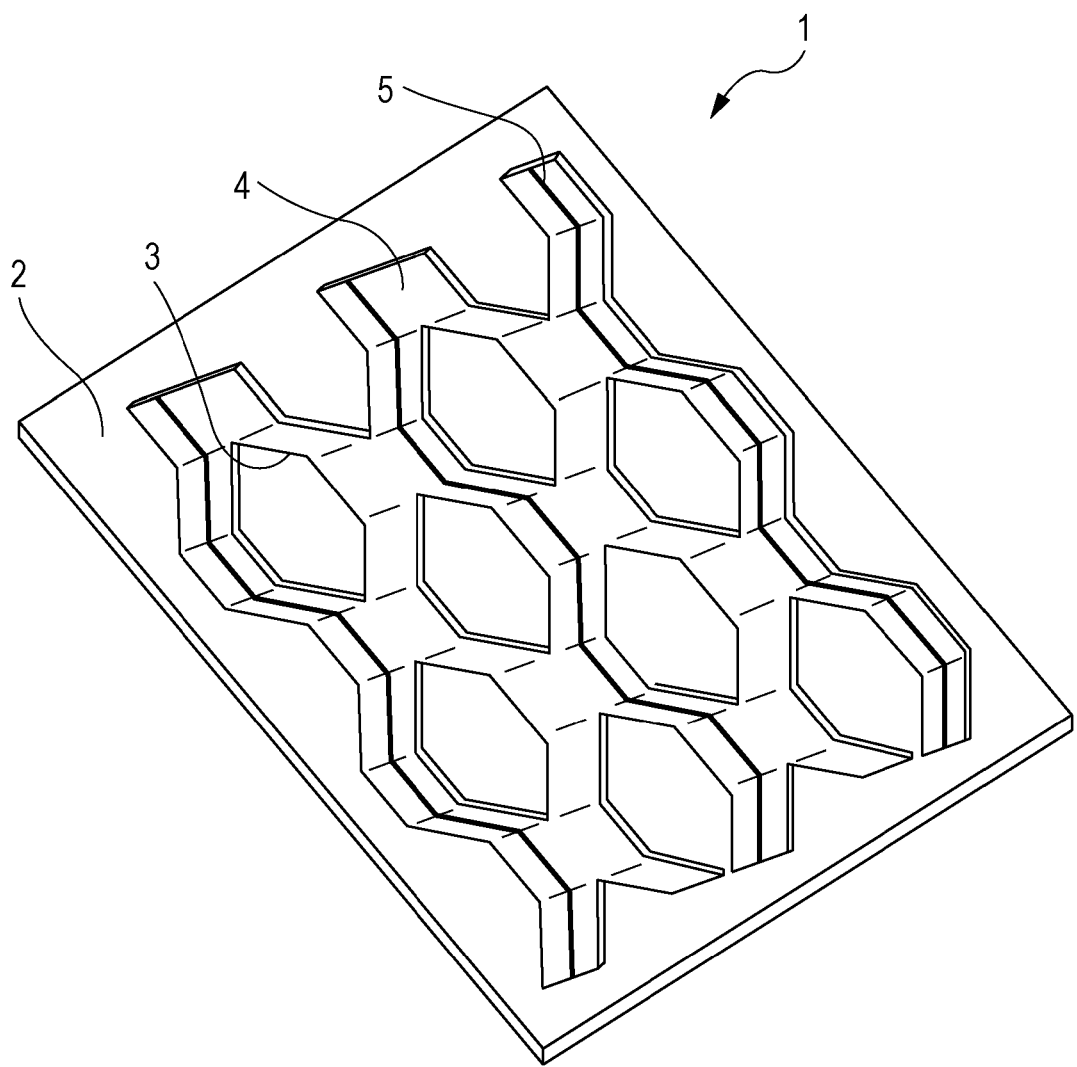
FIG. 1 is a schematic perspective view of an elastic flexible substrate according to a first aspect of the present disclosure.

An elastic flexible substrate according to one aspect of the present disclosure will be described below with reference to the drawings. Note that various components shown in the drawings are only schematically illustrated for understanding of the present disclosure and that the dimensional ratios between the components, the outer appearances of the components, and the like may be different from actual ones.

An elastic flexible substrate 1 according to one aspect of the present disclosure includes an insulating film base material 4 and an insulating member 2 which holds the insulating film base material 4. The insulating film base material 4 includes an opening 3 which is formed by opening a slit 6 (to be described later). That is, the insulating film base material 4 is provided in the insulating member 2 with the slits 6 opened. With this feature, the present disclosure can offer the flexible substrate 1 that is expandable or contractible.

An elastic flexible substrate 1 according to a first aspect of the present disclosure will be described in detail below.

Figure 2:
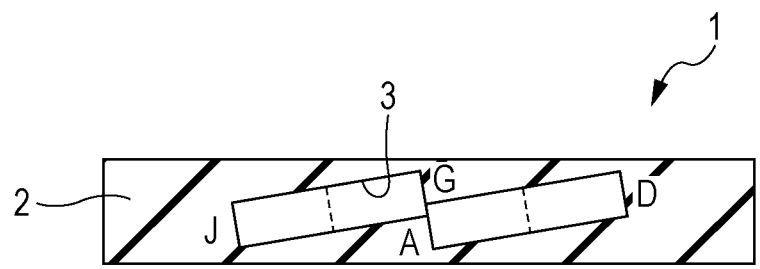
FIG. 2 is a partial schematic cross-sectional view of the elastic flexible substrate according to the first aspect of the present disclosure.
Figure 3:
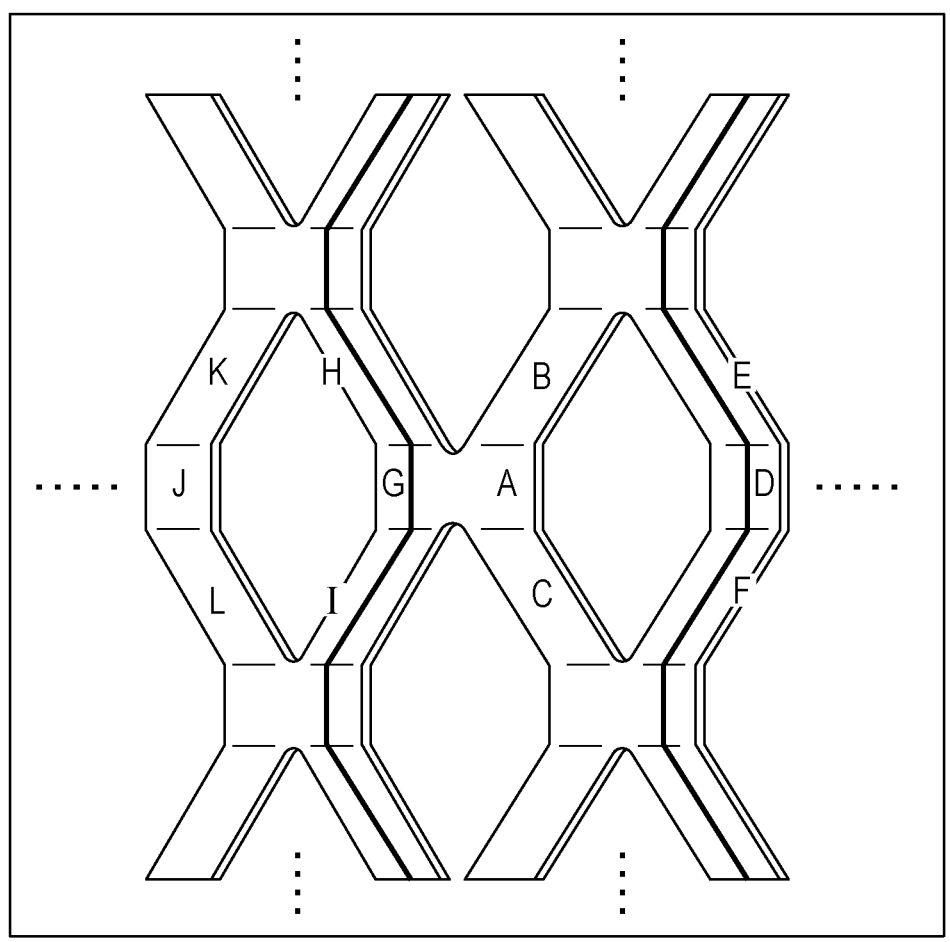
FIG. 3 is a partial schematic plan view of the elastic flexible substrate according to the first aspect of the present disclosure.
Figure 4:
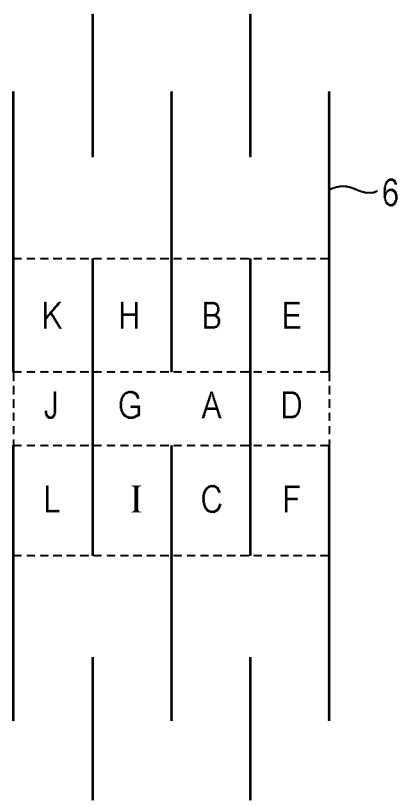
FIG. 4 is a partial schematic plan view of an insulating film base material constituting the elastic flexible substrate according to the first aspect of the present disclosure and shows a state before slits are opened.

FIG. 1 is a schematic perspective view showing the configuration of the elastic flexible substrate 1 according to the first aspect of the present disclosure. FIG. 2 is a partial schematic cross-sectional view of the elastic flexible substrate 1 according to the first aspect of the present disclosure and schematically shows an insulating film base material 4 which is held by the insulating member 2 while slits 6 are opened. FIG. 3 is a partial schematic plan view of the elastic flexible substrate 1 according to the first aspect of the present disclosure. The plan view in FIG. 3 shows an upper surface of the elastic flexible substrate 1 according to the first aspect of the present disclosure and also shows the insulating film base material 4 held by the insulating member 2 that is indicated by solid lines. FIG. 4 is a partial schematic plan view of the insulating film base material 4 constituting the elastic flexible substrate 1 according to the first aspect of the present disclosure and shows a state before the slits 6 are opened.

As shown in FIG. 1, in the elastic flexible substrate 1 according to the first aspect of the present disclosure, the insulating film base material 4 including a plurality of openings 3 includes a wire 5. The insulating member 2 covers the entire insulating film base material 4 including portions inside the openings 3 provided in the insulating film base material 4 and holds an opened state of each opening 3. The insulating member 2 has electrical insulation and elasticity. This configuration allows change of the opened status of each opening 3 in the insulating film base material 4 in the insulating member 2 and allows expansion or contraction of the elastic flexible substrate 1. Examples of the material for the insulating member 2 include silicone based resins, vinyl based resins, and styrene based resins. For example, a silicone based resin excellent in elasticity is used. The insulating film base material 4 can be constructed using a film composed of polyimide resin, PET resin, PEN resin, a liquid crystal polymer, or a combination thereof. A material transparent to visible light can be adopted as the material for the insulating film base material 4 and/or the insulating member 2.

The insulating film base material 4 in the elastic flexible substrate 1 according to the first aspect of the present disclosure will be more specifically described below.

In the first aspect, a plurality of slits 6 are formed parallel to each other in the insulating film base material 4, as shown in FIG. 4. In the insulating film base material 4, a plurality of slits 6 are formed at predetermined intervals on one straight line, and a plurality of slits 6 are formed at the predetermined intervals on a straight line (referred to as an adjacent straight line) adjacent to the one straight line. The slits 6 formed on the one straight line and the slits 6 formed on the adjacent straight line are staggered. Staggering here refers to locating a midpoint of each slit arranged on one straight line on a straight line connecting a midpoint between adjacent slits arranged on an adjacent straight line on one side of the one straight line and a midpoint between adjacent slits arranged on an adjacent straight line on the other side.

For ease of understanding of the shape of the opening 3, regions between the slits 6 are divided into distinct regions A to L in the insulating film base material 4, as shown in FIG. 4. The regions A to L will be described below. The insulating film base material 4 shown in FIG. 4 with a plurality of slits 6 formed therein is stretched in a direction orthogonal to the slits 6, and the slits 6 are opened, thereby forming the respective openings 3. FIG. 3 shows the regions A to L around the opened slits 6 (the openings 3). In the elastic flexible substrate 1 according to the first aspect of the present disclosure, the regions A to F on both sides of the slit 6 and the regions G to L on both sides of the slit 6 are tilted in the same direction, thereby forming the openings 3. Note that the openings 3 are formed such that the regions A and G located between the adjacent openings 3 are in the same plane. That is, as for the adjacent openings 3, a part of a portion defining one of the openings 3 of the insulating film base material 4 and a part of a portion defining the other opening 3 of the insulating film base material 4 are continuous. When a force stretching the insulating film base material 4 in a direction orthogonal to the slits 6 is applied to the insulating film base material 4, the openings 3 thus formed are deformed so as to open (in a direction separating the regions A and D) and expand in a direction in which the force is applied. When a force stretching the insulating film base material 4 in a direction parallel to the slits 6 is applied to the insulating film base material 4, the openings 3 are deformed so as to close (in a direction bringing the regions A and D closer) and expand in a direction in which the force is applied. That is, the shape of the opening 3 is deformable in response to expansion or contraction of the insulating film base material 4. In the elastic flexible substrate 1 according to the first aspect of the present disclosure, the insulating film base material 4 is provided in the insulating member 2 having elasticity such that the openings 3 thus formed are held. In the above-described manner, the elastic flexible substrate 1 according to the first aspect of the present disclosure that is expandable or contractible is constructed.

In the elastic flexible substrate 1 according to the first aspect of the present disclosure, wires 5 are formed at the insulating film base material 4. As described above, in the first aspect, the openings 3 are formed by providing the slits 6 in the one insulating film base material 4 without separating the insulating film base material 4 into a plurality of parts. This allows relatively free design of the wires 5. The "wire 5" generally constitutes a conductor circuit. The material for the wire 5 is not particularly limited and may be any material as long as the material has conductivity. Examples of the material for the wire 5 include a metal material, such as gold (Au), silver (Ag), copper (Cu), nickel (Ni), chrome (Cr), cobalt (Co), magnesium (Mg), calcium (Ca), platinum (Pt), molybdenum (Mo), iron (Fe), and/or zinc (Zn), a conductive oxide material, such as zinc oxide (ZnO), tin oxide (SnOt), indium tin oxide (ITO), fluorine-containing zinc oxide (FTO), ruthenium oxide ($RuO_2$), iridium oxide ($IrO_2$), or platinum oxide ($PtO_2$), or a polythiophene based or polyaniline based conductive polymer material.

The insulating member 2 is not particularly limited, but may be, for example, 0.1 to 5 mm in thickness. The insulating film base material 4 may be, for example, 10 to 2000 mm in length and width and 5 to 300 μm in thickness. The wire 5 may be, for example, 50 nm to 100 μm in thickness and 10 μm to 3 mm in width. The regions J, G, A, and D around the openings 3 in FIG. 3 may each have dimensions of, for example, 0.5 to 10 mm in X and Y directions. The regions B, C, E, F, H, I, K, and L around the openings 3 in FIG. 3 may each have, for example, a width dimension of 0.1 to 5 mm and a length dimension of 1 to 100 mm. The length of the slit 6 may be, for example, 5 to 200 mm.

An example in which the wires 5 are provided on one of two principal surfaces of the insulating film base material 4 is shown in FIG. 1. The present disclosure, however, is not limited to this, and the wire 5 may be provided not only on the one principal surface of the insulating film base material 4 but also on the other principal surface. The wire 5 provided on the one principal surface of the insulating film base material 4 and the wire 5 provided on the other principal surface of the insulating film base material 4 may be connected to each other via a connection via which is provided in the insulating film base material 4. Alternatively, the wire 5 may be provided inside the insulating film base material 4.

In the elastic flexible substrate 1 according to the first aspect of the present disclosure with the above-described configuration, the plurality of openings 3 are constructed by opening the slits 6 provided in the insulating film base material 4. At the time of expansion or contraction of the elastic flexible substrate 1, the tilts of portions (the regions A to L) around the openings 3 of the insulating film base material 4 change, which changes the shapes of the openings 3. At this time, regions located on both sides of the openings 3 of the insulating film base material 4 are tilted in the same direction. When the elastic flexible substrate 1 is expanded or contracted, stress does not concentrate on a specific spot of the insulating film base material 4. For this reason, breaks in the insulating film base material 4 caused when the insulating film base material 4 is repeatedly expanded or contracted can be reduced, and a highly reliable elastic flexible substrate can be constructed.

The elastic flexible substrate 1 according to the first aspect of the present disclosure is capable of expanding or contracting in a direction orthogonal to the slits 6 and in a direction parallel to the slits 6 and is expandable or contractible in an oblique direction or a direction perpendicular to the oblique direction. The elastic flexible substrate 1 is thus expandable or contractible even in an oblique direction. The elastic flexible substrate 1 according to the first aspect of the present disclosure including the above-described insulating film base material 4 can also be expanded or contracted on a free curved surface, such as a palm.

A second aspect of the present disclosure illustrates an application in which an electronic element 7 is mounted on the elastic flexible substrate 1 according to the first aspect. The second aspect of the present disclosure will be described below.

Figure 5:
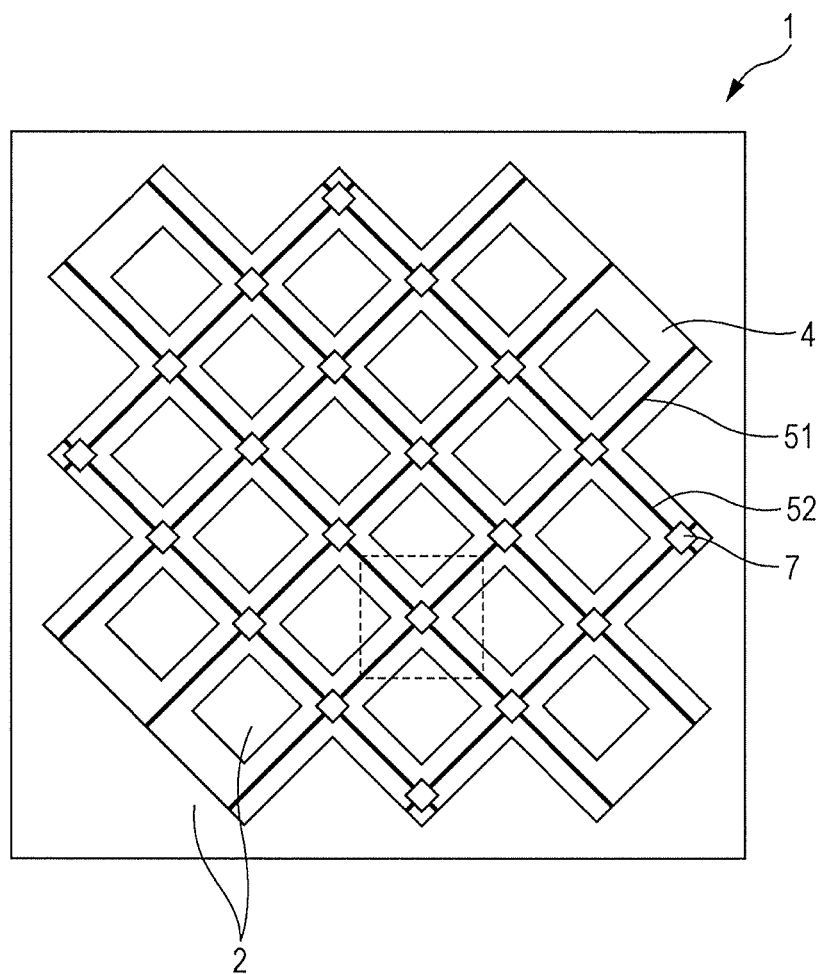
FIG. 5 is a schematic plan view of an application according to a second aspect of the present disclosure and is a view showing a state in which electronic elements are provided at an elastic flexible substrate.
Figure 6:
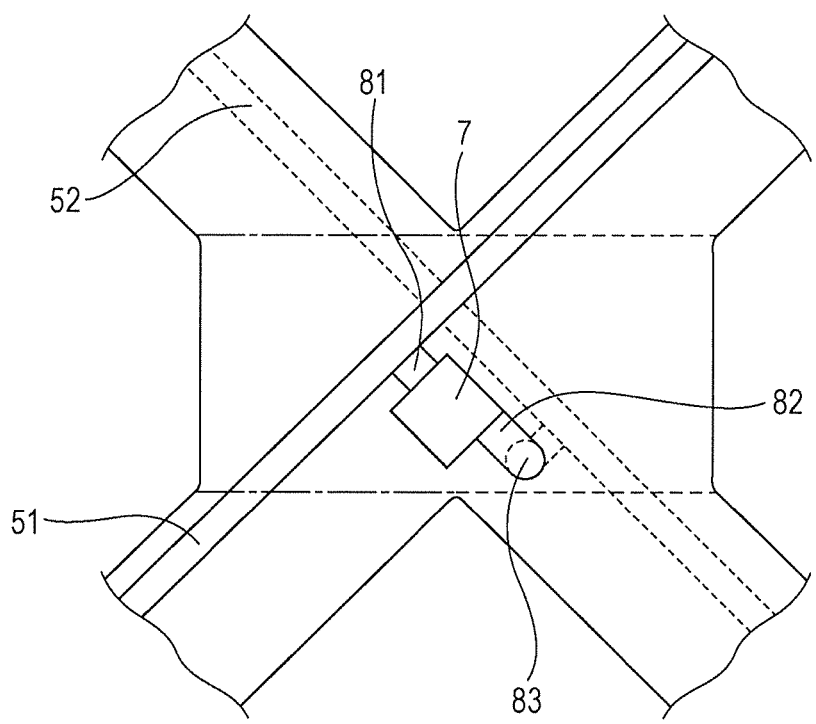
FIG. 6 is a partial schematic plan view showing, on an enlarged scale, a dashed portion in FIG. 5.

FIG. 5 is a schematic plan view of an application according to the second aspect of the present disclosure and shows a state in which the electronic elements 7 are provided at an elastic flexible substrate 1. FIG. 6 is a partial schematic plan view showing, on an enlarged scale, a part in FIG. 5 (a portion indicated by a dashed line).

In the application of the elastic flexible substrate 1 according to the second aspect of the present disclosure, the electronic element 7 is provided in a region (a region indicated as the regions A and G shown in, for example, FIG. 3) between each adjacent two of openings 3 in an insulating film base material 4. In the insulating film base material 4, wires 5 are composed of a plurality of first wires 51 which are arranged in a first direction and a plurality of second wires 52 which are arranged in a second direction different from the first direction, as shown in FIG. 5. The first wire 51 and the second wire 52 are arranged so as to intersect with each other above the insulating film base material 4 between the openings 3. The first wire 51 and the second wire 52 are arranged so as to intersect in a separated state. The electronic element 7 is provided at a position where the first wire 51 and the second wire 52 intersect. To electrically connect the electronic element 7 and the wire 5 (the first wire 51 and the second wire 52 will be simply referred to as the wires 5 hereinafter if distinction between the first wire 51 and the second wire 52 is unnecessary), an exposed portion of the wire 5 may be exposed from an insulating member 2. Note that each wire 5 need not have a linear shape as shown in FIG. 5 and that one of two wires 5 and the other wire 5 may be arranged so as to intersect with each other above the insulating film base material 4. An angle at which the wires 5 intersect can be arbitrarily set and is set at, for example, 60 to 120 degrees, 75 to 105 degrees, or 90 degrees.

As shown in FIG. 6, the first wire 51 is connected to the electronic element 7 via a connection wire 81 which is made of, for example, copper. The second wire 52 is connected to the electronic element 7 via a connection wire 82 which is made of, for example, copper. In the present second aspect, for example, the second wire 52 is located below the first wire 51, and the connection wire 82 is connected to the second wire 52 via a connection via 83. With this configuration, a voltage is applied to the electronic element 7 via the first wire 51 and the second wire 52.

Figure 7A:
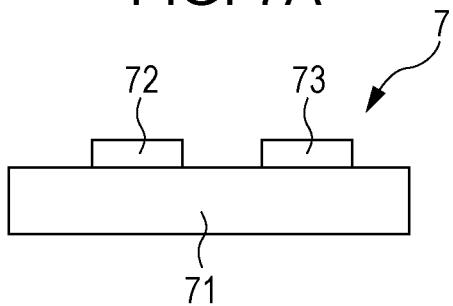
FIGS. 7A and 7B are views illustrating an electronic element in the application according to the second aspect of the present disclosure.
Figure 7B:
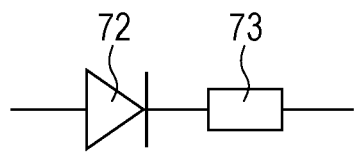

FIGS. 7A and 7B illustrate the electronic element 7 in the application according to the second aspect of the present disclosure. FIG. 7A is a schematic cross-sectional view of the electronic element 7, and FIG. 7B is a circuit diagram of the electronic element 7. The electronic element 7 is composed of, for example, an electronic element substrate 71 and a semiconductor device 72 and a sensor 73 which are provided on the electronic element substrate 71.

The "electronic element 7" here refers generally to a component constituting an electronic component, and the electronic element 7 is, for example, a semiconductor device, a sensor which senses temperature or pressure, or an actuator.

The term "semiconductor device" here refers to a luminescence element, a light-receiving element, a diode, a transistor, or the like. Use of a luminescence element allows production of a highly elastic display. Use of an actuator allows production of a massaging cloth which can vibrate at an arbitrary point. Other specific examples of the electronic element 7 include an IC (for example, a control IC), an inductor, a capacitor, a power device, a chip resistor, a chip capacitor, a chip varistor, a chip thermistor, a chip-shaped multilayer filter, and a connection terminal.

For example, if the electronic element 7 is a pressure-sensitive element, a diode is used as the semiconductor device 72, and a pressure sensor is used as the sensor 73. Sequential scanning of the first wire 51 and the second wire 52 electrically connected to a pressure-sensitive element allows scanning of a value output from a pressure sensor. If pressure sensors are arranged in a matrix, the position of a person or the like located on an arbitrary one of the pressure sensors can be detected.

Figure 8:
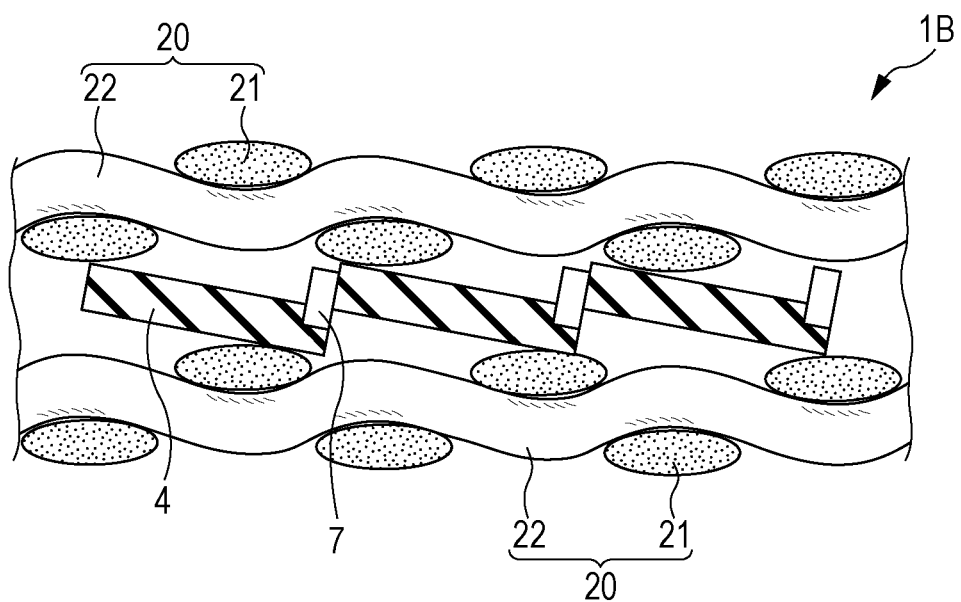
FIG. 8 is a partial schematic cross-sectional view of an elastic flexible substrate according to a third aspect of the present disclosure.

An elastic flexible substrate 1B according to a third aspect of the present disclosure will be described. FIG. 8 is a partial schematic cross-sectional view of the elastic flexible substrate 1B according to the third aspect of the present disclosure.

In the elastic flexible substrate 1B according to the third aspect of the present disclosure, an insulating film base material 4 configured in the same manner as in the first aspect is held by an insulating member 20 which is configured in a manner different from the first aspect. That is, in the elastic flexible substrate 1B according to the third aspect, the insulating film base material 4 is held by the insulating member 20 while slits 6 are opened. Note that the elastic flexible substrate 1B according to the third aspect is shown with an electronic element 7 mounted thereon in FIG. 8.

Differences of the elastic flexible substrate 1B according to the third aspect from the first aspect will be described below.

In the third aspect, a chemical fiber, cotton, woven fabric, non-woven fabric, or the like is used as the material for the insulating member 20, and the insulating film base material 4 is held by the insulating members 20 provided on upper and lower surfaces of the insulating film base material 4. The insulating member 20 includes first fiber bundles 21 and second fiber bundles 22 and is formed by weaving together the first fiber bundles 21 and the second fiber bundles 22 extending in direction orthogonal to each other. The insulating member 20 has elasticity because the insulating member 20 has an elastic weave or the material for the insulating member 20 itself has elasticity.

In the third aspect, the insulating film base material 4 has an opening 3 which is formed by opening a slit, and portions in regions located on both sides of the openings 3 of the insulating film base material 4 are tilted in the same direction, like the first aspect. The elastic flexible substrate 1B according to the third aspect with the above-described configuration achieves the same working effects as those of the elastic flexible substrate 1 according to the first aspect.

Figure 12A:
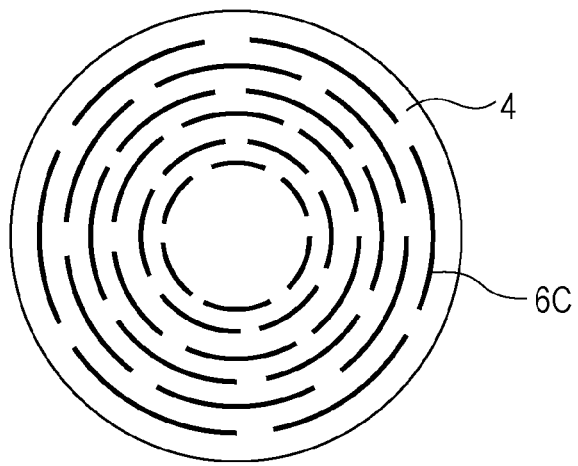
FIGS. 12A to 12C are views showing the elastic flexible substrate according to the fourth aspect of the present disclosure.
Figure 12B:
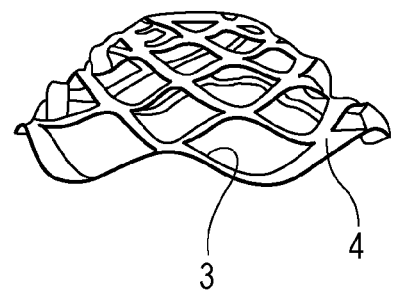
Figure 12C:
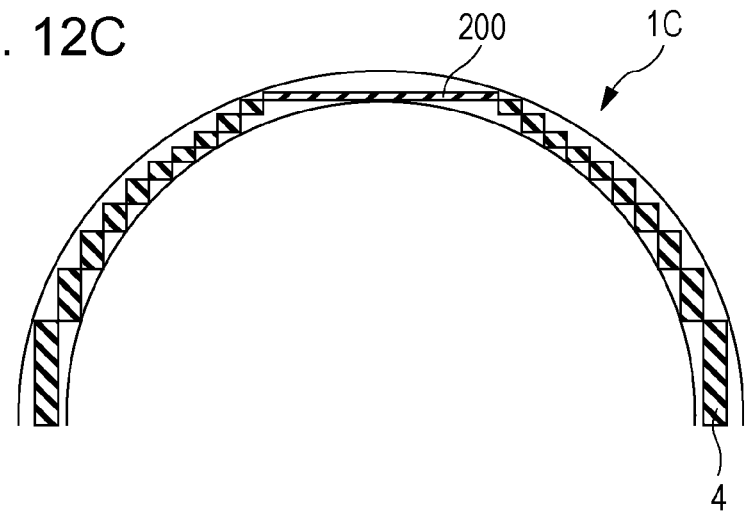

An elastic flexible substrate IC according to a fourth aspect of the present disclosure will be described. The elastic flexible substrate IC according to the fourth aspect is constructed using an insulating film base material 4 shown in FIG. 12A in which a plurality of slits 6C are concentrically formed. As shown in FIG. 12B, the insulating film base material 4 is stretched in a hemispherical shape such that the plurality of concentrically formed slits 6C open. As shown in FIG. 12C, the insulating film base material 4 is held by an insulating member 200 while keeping the hemispherical shape. A plurality of slits 6C are provided on the circumference of each of circles of graduated radii. As shown in FIG. 12A, the slits 6C can be formed such that the slit 6C formed at a position far from a center is longer than the slit 6C on the inner side. The slit 6C is not particularly limited and may be 5 to 300 mm in length and 50 to 500 μm in width. The elastic flexible substrate 1C according to the fourth aspect with the above-described configuration is capable of expanding or contracting by deforming openings 3 which are formed by opening the slits 6C. For example, the radius of the hemispherical shape can be changed.

Figure 9:
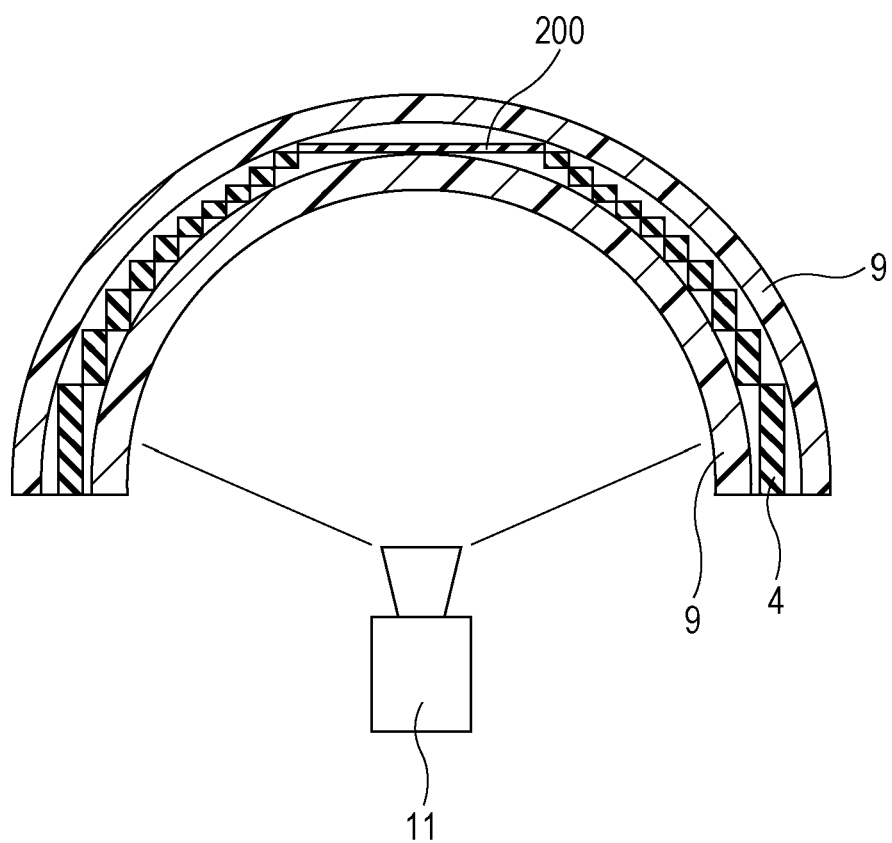
FIG. 9 is a view showing an application of an elastic flexible substrate according to a fourth aspect of the present disclosure.

FIG. 9 shows an application of the elastic flexible substrate IC according to the fourth aspect of the present disclosure. The elastic flexible substrate IC according to the fourth aspect is provided on a resin member 9 forming a hemispherical shape. In the application, the elastic flexible substrate IC may be provided between two resin members 9 forming respective hemispherical shapes, as shown in FIG. 9. The resin member 9 is not particularly limited and may be, for example, 10 to 80 cm in diameter and 0.1 to 5 mm in thickness. The insulating member 200 may be, for example, 0.1 to 5 mm in thickness. An acrylic resin semitransparent or transparent to visible light may be used as the insulating member 200 and the resin member 9. The use allows construction of, for example, a hemispherical display. In the elastic flexible substrate IC according to the fourth aspect of the present disclosure, wires 5 can be concentrically provided at the insulating film base material 4. In the present aspect, for example, a vinyl based resin, a styrene based resin, a chemical fiber, a glass fiber, woven fabric, non-woven fabric, and the like can be used as the insulating member 200, in addition to an acrylic resin. For example, an acrylic resin or, more specifically, an acrylic thermoplastic elastomer is preferably used. To be electrically connected to an external electronic element, a part of the wire 5 may be exposed from the insulating member 200 and/or the resin member 9 provided on the elastic flexible substrate 1C according to the fourth aspect of the present disclosure. In the present aspect, the wire 5 can be constructed from a combination of an acrylic thermoplastic elastomer and ITO. The combination ensures transparency of the wire 5 to visible light.

The elastic flexible substrate 1C according to the fourth aspect of the present disclosure with the above-described configuration has the same working effects as those of the elastic flexible substrate 1 according to the first aspect of the present disclosure. In addition, elastic flexible substrates corresponding to various hemispherical shapes can be provided.

Although the elastic flexible substrate 1C according to the fourth aspect of the present disclosure is an elastic flexible substrate applicable to a hemispherical shape, the present disclosure is not limited to this. It is also possible to provide elastic flexible substrates corresponding to a conical shape, a triangular pyramidal shape, a quadrangular pyramidal shape, a polygonal pyramidal shape, and the like.

Note that the resin member 9 forming a hemispherical shape can be made to function as a display by projecting an image from below the resin member 9 using a projector 11, as shown in FIG. 9. Making the elastic flexible substrate 1C according to the present aspect provided on the resin member 9 forming a hemispherical shape operate as a projection capacitive touch panel allows detection of a touch location of a finger or the like. That is, the elastic flexible substrate 1C with the resin member 9 can be made to function as a device including a hemispherical display and a hemispherical touch panel.

<Manufacturing Method for Elastic Flexible Substrate of Present Disclosure>

An elastic flexible substrate 1 according to one aspect of the present disclosure can be manufactured through the processes below.

(Wire Layer Installation Process)

Figure 10A:
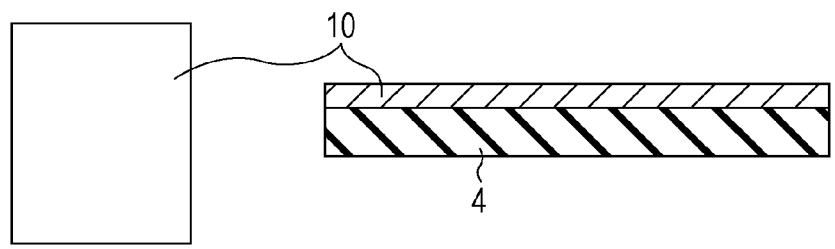
FIGS. 10A to 10E are views showing a manufacturing method for an elastic flexible substrate according to the present disclosure.

As shown in FIG. 10A, a wire layer 10 is first formed all over an insulating film base material 4.

(Wire Formation Process)

Figure 10B:
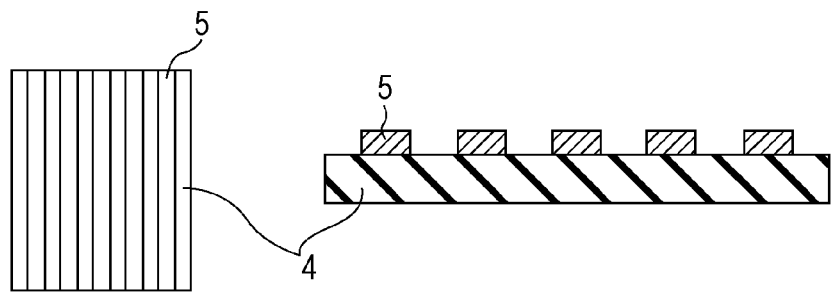

As shown in FIG. 10B, the wire layer 10 is patterned by, for example, etching using transfer or photolithography, thereby forming wires 5 in a desired shape on the insulating film base material 4.

(Slit Formation Process)

Figure 10C:
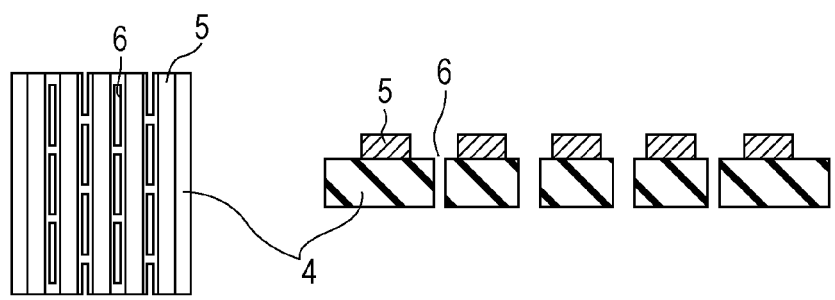
Figure 11A:
FIGS. 11A to 11C are views showing possible shapes of a slit.
Figure 11B:
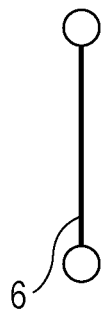
Figure 11C:
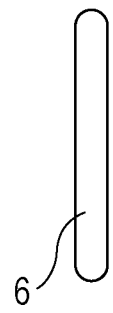

As shown in FIG. 10C, slits 6 are formed in exposed portions of the insulating film base material 4 by punching so as to extend, for example, in the same direction as a direction in which the wires 5 extend. Note that the slits 6 are not limited to the same direction and may be formed so as to extend in a direction different from the direction, in which the wires 5 extend, such as a direction perpendicular to the direction. Alternatively, the slits 6 may be formed using a film base material having photosensitivity or a Thomson blade. Examples of the shape of the slit 6 include a linear shape (FIG. 11A), a shape with circles at both ends (FIG. 11B), and/or an oval shape (FIG. 11C), as shown in FIGS. 11A to 11C. To inhibit distortion at or concentration of stress on an end of the slit 6 at the time of opening the slit 6 in the process below, for example, a shape with circles at both ends or an oval shape may be adopted as the shape of the slit 6.

(Slit Opening Process)

Figure 10D:
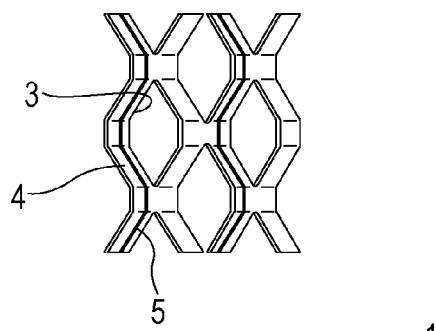

As shown in FIG. 10D, the slits 6 provided in the insulating film base material 4 are opened in a direction perpendicular to a direction in which the slits 6 extend, and a state with the formed openings 3 is maintained.

(Slit Opened Status Holding Process)

Figure 10E:
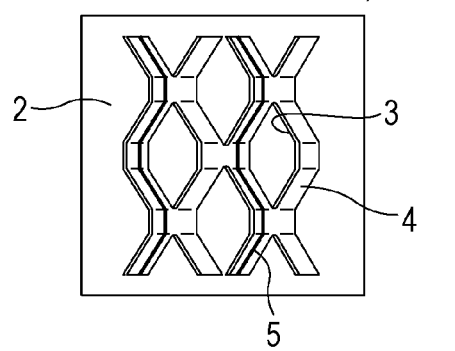

Finally, as shown in FIG. 10E, the insulating film base material 4 with the slits 6 opened is sandwiched between two insulating members 2, and hot pressing is performed, thereby manufacturing the elastic flexible substrate 1 according to the one aspect of the present disclosure with an opened state of each opening 3 held by the insulating members 2.

In this process, the elastic flexible substrate 1 according to the one aspect of the present disclosure may be manufactured by sandwiching the insulating film base material 4 with the slits 6 opened between photocuring resin members and photocuring the photocuring resin members. Alternatively, the insulating member 2 may be provided by placing the insulating film base material 4 with the slits 6 opened in a die and performing molding. Alternatively, the elastic flexible substrate 1 according to the one aspect of the present disclosure may be manufactured by fixing the insulating film base material 4 with the slits 6 opened, applying the material for the insulating member 2 to the insulating film base material 4 in a thin layer using a blade or the like, and then curing the material.

Note that the elastic flexible substrate 1 according to the one aspect of the present disclosure can be made hemispherical by providing, on the hemispherical resin member 9, the insulating film base material 4 having a plurality of concentrically arranged openings 3 and a plurality of wires 5 (sees FIGS. 12A to 12C) concentrically arranged on the insulating film base material 4. Alternatively, a part of the wire 5 may be exposed from the insulating member 2, an electronic element 7 may be provided on the wire 5, and the wire 5 and the electronic element 7 may be electrically connected.

The elastic flexible substrate 1 according to one aspect of the present disclosure and a manufacturing method for the elastic flexible substrate 1 have been described above. It is to be understood that the present disclosure is not limited to this and that various changes will be made by those skilled in the art without departing from the scope of the disclosure defined in the claims below.

The present disclosure includes the aspects below.

According to one aspect of the present disclosure, there is provided an elastic flexible substrate including an insulating film base material which includes a wire, wherein the insulating film base material includes an opening which is formed by opening a slit, and an opened state of the opening is held by an insulating member.

According to the one aspect, in an elastic flexible substrate according to the present disclosure, an insulating film base material serving as a component includes an opening which is formed by opening a slit, and an opened state of the opening is held by an insulating member. With this configuration, the elastic flexible substrate has elasticity.

For example, in the elastic flexible substrate according to the one aspect, a shape of the opening may be deformable in response to expansion or contraction of the insulating film base material.

For example, in the elastic flexible substrate according to the one aspect, portions, located on both sides of the opening, of the insulating film base material may be tilted in a same direction.

For example, in the elastic flexible substrate according to the one aspect, the opening includes two adjacent openings, and a part of a portion, defining one opening of the two adjacent openings, of the insulating film base material and a part of a portion, defining the other opening of the two adjacent openings, of the insulating film base material may be continuous.

For example, in the elastic flexible substrate according to the one aspect, the wire includes a first wire and the second wire, the insulating film base material has two principal surfaces, and the first wire which is provided on one of the two principal surfaces of the insulating film base material and the second wire which is provided on the other principal surface of the insulating film base material may be electrically connected via a connection via.

For example, in the elastic flexible substrate according to the one aspect, the wire includes a first wire and a second wire, and the first wire and the second wire may intersect in a separated state above the insulating film base material between the openings.

For example, in the elastic flexible substrate according to the one aspect, the opening may include a plurality of openings, and the plurality of openings may be concentrically arranged.

For example, in the elastic flexible substrate according to the one aspect, the insulating film base material may form a hemispherical shape as a whole.

For example, in the elastic flexible substrate according to the one aspect, the wire may be locally exposed from the insulating member, and an electronic element may be provided on the exposed portion of the wire.

For example, in the elastic flexible substrate according to the one aspect, the electronic element may be at least one selected from the group consisting of a semiconductor device, a sensor element, and an actuator.

For example, in the elastic flexible substrate according to the one aspect, at least one selected from the group consisting of the insulating film base material and the insulating member may be transparent to visible light.

For example, in the elastic flexible substrate according to the one aspect, the insulating member may have elasticity.

For example, in the elastic flexible substrate according to the one aspect, the insulating member may be made of at least one selected from the group consisting of a silicone based resin, a chemical fiber, cotton, woven fabric, and non-woven fabric.

For example, in the elastic flexible substrate according to the one aspect, the insulating film base material may be made of at least one selected from the group consisting of polyimide resin, PET resin, PEN resin, and a liquid crystal polymer.

For example, in the elastic flexible substrate according to the one aspect, the wire may be made of at least one selected from the group consisting of copper, silver, and ITO.

A manufacturing method for an elastic flexible substrate according to another aspect of the present disclosure includes providing a wire at an insulating film base material, forming a slit in the insulating film base material, opening the slit, and holding an opened state of the slit by an insulating member.

For example, in the manufacturing method for an elastic flexible substrate according to the aspect, a member having elasticity may be used as the insulating member.

For example, in the manufacturing method for an elastic flexible substrate according to the aspect, a shape of the slit may be at least one selected from the group consisting of a linear shape, a shape with circles at both ends, and an oval shape.

An elastic flexible substrate according to the present disclosure can be used as a circuit board having elasticity.

What is claimed is:

1. An elastic flexible substrate comprising:
an insulating film base material; and
a wire provided at the insulating film base material, wherein
the insulating film base material includes an opening which is formed by opening a slit, and
an opened state of the opening is held by an insulating member.

2. The elastic flexible substrate according to claim 1, wherein a shape of the opening is deformable in response to expansion or contraction of the insulating film base material.

3. The elastic flexible substrate according to claim 1, wherein portions, located on both sides of the opening, of the insulating film base material are tilted in a same direction.

4. The elastic flexible substrate according to claim 1, wherein
the opening includes two adjacent openings, and
a part of a portion, defining one opening of the two adjacent openings, of the insulating film base material and a part of a portion, defining the other opening of the two adjacent openings, of the insulating film base material are continuous.

5. The elastic flexible substrate according to claim 1, wherein
the wire includes a first wire and a second wire,
the insulating film base material has two principal surfaces, and
the first wire which is provided on one of the two principal surfaces of the insulating film base material and the second wire which is provided on the other principal surface of the insulating film base material are electrically connected via a connection via.

6. The elastic flexible substrate according to claim 1, wherein
the wire includes a first wire and a second wire, and
the first wire and the second wire intersect in a separated state above the insulating film base material between two adjacent openings.

7. The elastic flexible substrate according to claim 1, wherein
the opening includes a plurality of openings, and
the plurality of openings are concentrically arranged.

8. The elastic flexible substrate according to claim 7, wherein the insulating film base material forms a hemispherical shape as a whole.

9. The elastic flexible substrate according to claim 1, wherein
the wire is locally exposed from the insulating member, and
an electronic element is provided on the exposed portion of the wire.

10. The elastic flexible substrate according to claim 9, wherein the electronic element is at least one selected from a group consisting of a semiconductor device, a sensor element, and an actuator.

11. The elastic flexible substrate according to claim 1, wherein at least one selected from a group consisting of the insulating film base material and the insulating member is transparent to visible light.

12. The elastic flexible substrate according to claim 1, wherein the insulating member has elasticity.

13. The elastic flexible substrate according to claim 1, wherein the insulating member is made of at least one selected from a group consisting of a silicone based resin, a chemical fiber, cotton, woven fabric, and non-woven fabric.

14. The elastic flexible substrate according to claim 1, wherein the insulating film base material is made of at least one selected from a group consisting of polyimide resin, PET resin, PEN resin, and a liquid crystal polymer.

15. The elastic flexible substrate according to claim 1, wherein the wire is made of at least one selected from a group consisting of copper, silver, and ITO.

16. A method for manufacturing an elastic flexible substrate, comprising:
providing a wire at an insulating film base material;
forming a slit in the insulating film base material;
opening the slit; and
holding an opened state of the slit by an insulating member.

17. The method according to claim 16, wherein a member having elasticity is used as the insulating member.

18. The method according to claim 16, wherein a shape of the slit is at least one selected from a group consisting of a linear shape, a shape with circles at both ends, and an oval shape.

* * * * *